(12) United States Patent
Elliott et al.

(10) Patent No.: US 7,857,570 B2
(45) Date of Patent: *Dec. 28, 2010

(54) METHOD AND APPARATUS FOR SUPPLYING SUBSTRATES TO A PROCESSING TOOL

(75) Inventors: Martin R. Elliott, Round Rock, TX (US); Michael R. Rice, Pleasanton, CA (US); Robert B. Lowrance, Los Gatos, CA (US); Jeffrey C. Hudgens, San Francisco, CA (US); Eric A. Englhardt, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 207 days.

This patent is subject to a terminal disclaimer.

(21) Appl. No.: 12/100,388

(22) Filed: Apr. 9, 2008

(65) Prior Publication Data

US 2008/0187414 A1    Aug. 7, 2008

Related U.S. Application Data

(63) Continuation of application No. 10/650,479, filed on Aug. 28, 2003, now abandoned.

(51) Int. Cl.
*B65G 49/07* (2006.01)
(52) U.S. Cl. .............. 414/217; 414/217.1; 414/800; 414/940; 198/346.3; 198/465.1
(58) Field of Classification Search ............ 414/217, 414/217.1, 800, 940; 198/465.1, 346.3
See application file for complete search history.

(56) References Cited

U.S. PATENT DOCUMENTS

| | | |
|---|---|---|
| 1,639,758 A | 8/1927 | Webb |
| 1,906,036 A | 4/1933 | Wunderlich |
| 2,153,071 A | 4/1939 | Bishop |
| 2,949,996 A | 8/1960 | Tonelli |
| 3,058,604 A | 10/1962 | Harper et al. |
| 3,131,801 A | 5/1964 | Marchetti |
| 3,184,032 A | 5/1965 | Jonsson |
| 3,587,817 A | 6/1971 | Bornstein et al. |
| 3,610,448 A | 10/1971 | Bornfleth |
| 3,710,921 A | 1/1973 | Petiet |

(Continued)

FOREIGN PATENT DOCUMENTS

EP     0 277 536     8/1988

(Continued)

OTHER PUBLICATIONS

Elliott et al., U.S. Appl. No. 12/359,310, filed Jan. 24, 2009.

(Continued)

*Primary Examiner*—Michael S Lowe
(74) *Attorney, Agent, or Firm*—Dugan & Dugan

(57) ABSTRACT

In one aspect, a substrate loading station for a processing tool includes plural load ports. Each load port is operatively coupled to the processing tool and has a mechanism for opening a substrate carrier. A carrier handler transports substrate carriers from a factory exchange location to the load ports without placing the carriers on any carrier support location other than the load ports. Numerous other aspects are provided.

17 Claims, 6 Drawing Sheets

U.S. PATENT DOCUMENTS

| | | |
|---|---|---|
| 3,710,923 A | 1/1973 | Fromme et al. |
| 3,722,656 A | 3/1973 | Loomis, Jr. et al. |
| 3,734,263 A | 5/1973 | Dirks |
| 3,815,723 A | 6/1974 | Wright et al. |
| 3,901,376 A | 8/1975 | Dardaine et al. |
| 3,990,569 A | 11/1976 | Aiuola |
| 4,006,813 A | 2/1977 | Fluck |
| 4,029,194 A | 6/1977 | Feurstein et al. |
| 4,033,403 A | 7/1977 | Seaton et al. |
| 4,040,302 A | 8/1977 | Katarao |
| 4,044,886 A | 8/1977 | Sender |
| 4,166,527 A | 9/1979 | Beezer |
| 4,222,479 A | 9/1980 | Dugan et al. |
| 4,261,236 A | 4/1981 | Verjux |
| 4,266,652 A | 5/1981 | Bald |
| 4,294,344 A | 10/1981 | Maanen |
| 4,340,137 A | 7/1982 | Foster |
| 4,401,522 A | 8/1983 | Buschow et al. |
| 4,450,950 A | 5/1984 | Foote, Jr. |
| 4,506,779 A | 3/1985 | Seragnoli |
| 4,524,858 A | 6/1985 | Maxey |
| 4,534,843 A | 8/1985 | Johnson et al. |
| 4,538,720 A | 9/1985 | Limousin |
| 4,540,088 A | 9/1985 | Bergh |
| 4,549,647 A | 10/1985 | Cosse |
| 4,552,261 A | 11/1985 | Raudat et al. |
| 4,584,944 A | 4/1986 | Dehne |
| 4,585,126 A | 4/1986 | Paddock et al. |
| 4,603,770 A | 8/1986 | Hartness |
| 4,650,264 A | 3/1987 | Dahnert |
| 4,653,630 A | 3/1987 | Bravin |
| 4,667,809 A | 5/1987 | Raybuck |
| 4,679,685 A | 7/1987 | Inoko |
| 4,680,919 A | 7/1987 | Hirama et al. |
| 4,693,359 A | 9/1987 | Mattei et al. |
| 4,702,365 A | 10/1987 | Pak |
| 4,708,727 A | 11/1987 | Cardenas-Franco et al. |
| 4,720,006 A | 1/1988 | Lenherr |
| 4,730,733 A | 3/1988 | Kawamura et al. |
| 4,750,605 A | 6/1988 | Brems et al. |
| 4,759,439 A | 7/1988 | Hartlepp |
| 4,765,453 A | 8/1988 | Bucher |
| 4,775,046 A | 10/1988 | Gramarossa et al. |
| 4,805,759 A | 2/1989 | Rochet et al. |
| 4,813,528 A | 3/1989 | Hartlepp |
| 4,830,180 A | 5/1989 | Ferguson et al. |
| 4,850,102 A | 7/1989 | Hironaka et al. |
| 4,852,717 A | 8/1989 | Ross et al. |
| 4,854,440 A | 8/1989 | Laube et al. |
| 4,869,637 A | 9/1989 | deGroot |
| 4,898,373 A | 2/1990 | Newsome |
| 4,901,843 A | 2/1990 | Lashyro |
| 4,921,092 A | 5/1990 | Crawford et al. |
| 4,936,438 A | 6/1990 | Waineo |
| 4,964,776 A | 10/1990 | Wakita et al. |
| 5,048,164 A | 9/1991 | Harima |
| 5,052,544 A | 10/1991 | Anderson |
| 5,064,337 A | 11/1991 | Asakawa et al. |
| 5,086,909 A | 2/1992 | Powell, Jr. |
| 5,092,450 A | 3/1992 | Schommartz et al. |
| 5,099,896 A | 3/1992 | Ritola |
| 5,110,249 A | 5/1992 | Norman |
| 5,113,992 A | 5/1992 | Sadamori |
| 5,123,518 A | 6/1992 | Pfaff |
| 5,135,102 A | 8/1992 | Sjogren et al. |
| 5,184,712 A | 2/1993 | Leypold et al. |
| 5,207,309 A | 5/1993 | Simpkin et al. |
| 5,226,211 A | 7/1993 | Jones |
| 5,231,926 A | 8/1993 | Williams et al. |
| 5,246,218 A | 9/1993 | Yap et al. |
| 5,261,935 A | 11/1993 | Ishii et al. |
| 5,269,119 A | 12/1993 | Tolson |
| 5,275,275 A | 1/1994 | Boldrini et al. |
| 5,332,013 A | 7/1994 | Sugita et al. |
| 5,341,915 A | 8/1994 | Cordia et al. |
| 5,382,127 A | 1/1995 | Garric et al. |
| 5,387,265 A | 2/1995 | Kakizaki et al. |
| 5,388,945 A | 2/1995 | Garric et al. |
| 5,411,358 A | 5/1995 | Garric et al. |
| 5,439,091 A | 8/1995 | Mason |
| 5,460,478 A | 10/1995 | Akimoto et al. |
| 5,558,198 A | 9/1996 | Juarez |
| 5,560,471 A | 10/1996 | Prochut et al. |
| 5,570,990 A | 11/1996 | Bonora et al. |
| 5,586,585 A | 12/1996 | Bonora et al. |
| 5,603,777 A | 2/1997 | Ohashi |
| 5,617,944 A | 4/1997 | McTaggart |
| 5,628,604 A | 5/1997 | Murata et al. |
| 5,628,614 A | 5/1997 | Pazdernik et al. |
| 5,653,327 A | 8/1997 | Buday, Jr. et al. |
| 5,664,254 A | 9/1997 | Ohkura et al. |
| 5,667,056 A | 9/1997 | Kimmet |
| 5,762,544 A | 6/1998 | Zuniga et al. |
| 5,782,338 A | 7/1998 | Schuster et al. |
| 5,788,447 A | 8/1998 | Yonemitsu et al. |
| 5,797,249 A | 8/1998 | Hartness |
| 5,823,319 A | 10/1998 | Resnick et al. |
| 5,827,118 A | 10/1998 | Johnson et al. |
| 5,829,574 A | 11/1998 | DelSanto |
| 5,829,939 A | 11/1998 | Iwai et al. |
| 5,865,292 A | 2/1999 | Aguilar et al. |
| 5,884,392 A | 3/1999 | Lafond |
| 5,887,701 A | 3/1999 | Spatafora |
| 5,955,857 A | 9/1999 | Kwon et al. |
| 5,957,648 A | 9/1999 | Bachrach |
| 5,980,183 A | 11/1999 | Fosnight |
| 6,026,561 A | 2/2000 | Lafond |
| 6,036,426 A | 3/2000 | Hillman |
| 6,042,324 A | 3/2000 | Aggarwal et al. |
| 6,054,181 A | 4/2000 | Nanbu et al. |
| 6,079,927 A | 6/2000 | Muka |
| 6,092,979 A | 7/2000 | Miselli |
| 6,142,722 A | 11/2000 | Genov et al. |
| 6,183,186 B1 | 2/2001 | Howells et al. |
| 6,209,710 B1 | 4/2001 | Mueller et al. |
| 6,223,887 B1 | 5/2001 | Andou |
| 6,227,345 B1 | 5/2001 | Miyamoto |
| 6,227,346 B1 | 5/2001 | Lecomte et al. |
| 6,227,348 B1 | 5/2001 | Frei et al. |
| 6,234,300 B1 | 5/2001 | De Vos et al. |
| 6,235,634 B1 | 5/2001 | Law et al. |
| 6,309,279 B1 | 7/2001 | Bowman et al. |
| 6,280,134 B1 | 8/2001 | Nering |
| 6,283,692 B1 | 9/2001 | Perlov et al. |
| 6,304,051 B1 | 10/2001 | Sagues et al. |
| 6,379,096 B1 | 4/2002 | Beutler et al. |
| 6,435,330 B1 | 8/2002 | Bonora et al. |
| 6,435,331 B1 | 8/2002 | Olson et al. |
| 6,439,822 B1 | 8/2002 | Kimura et al. |
| 6,468,021 B1 | 10/2002 | Bonora et al. |
| 6,481,558 B1 | 11/2002 | Bonora et al. |
| 6,506,009 B1 | 1/2003 | Nulman et al. |
| 6,511,065 B1 | 1/2003 | Cote et al. |
| 6,517,304 B1 | 2/2003 | Matsumoto |
| 6,524,463 B2 | 2/2003 | Gramarossa et al. |
| 6,579,052 B1 | 6/2003 | Bonora et al. |
| 6,581,750 B1 | 6/2003 | Tweedy et al. |
| 6,699,329 B2 | 3/2004 | Mueller et al. |
| 6,826,986 B2 | 12/2004 | Lim et al. |
| 6,919,001 B2 | 7/2005 | Fairbairn et al. |
| 6,955,517 B2 | 10/2005 | Nulman et al. |
| 7,168,553 B2 | 1/2007 | Rice et al. |
| 7,230,702 B2 | 6/2007 | Rice et al. |
| 7,234,584 B2 | 6/2007 | Rice et al. |

| | | |
|---|---|---|
| 7,234,908 B2 | 6/2007 | Nulman et al. |
| 7,243,003 B2 | 7/2007 | Elliott et al. |
| 7,346,431 B2 | 3/2008 | Elliott et al. |
| 7,359,767 B2 | 4/2008 | Elliott et al. |
| 7,360,981 B2 | 4/2008 | Weaver |
| 7,409,263 B2 | 8/2008 | Elliott et al. |
| 7,527,141 B2 | 5/2009 | Rice et al. |
| 2001/0043849 A1 | 11/2001 | Perlov et al. |
| 2002/0090282 A1 | 7/2002 | Bachrach |
| 2003/0010449 A1 | 1/2003 | Gramarossa et al. |
| 2003/0031538 A1 | 2/2003 | Weaver |
| 2003/0110649 A1 | 6/2003 | Hudgens |
| 2003/0202865 A1 | 10/2003 | Ponnekanti et al. |
| 2003/0202868 A1 | 10/2003 | Bachrach |
| 2004/0062633 A1 | 4/2004 | Rice et al. |
| 2004/0076596 A1 | 4/2004 | Elliott et al. |
| 2004/0081538 A1 | 4/2004 | Rice et al. |
| 2004/0081545 A1 | 4/2004 | Elliott et al. |
| 2004/0081546 A1 | 4/2004 | Elliott et al. |
| 2004/0082546 A1 | 4/2004 | Elliott et al. |
| 2004/0193300 A1 | 9/2004 | Rice et al. |
| 2005/0095110 A1 | 5/2005 | Lowrance et al. |
| 2005/0135903 A1 | 6/2005 | Rice et al. |
| 2005/0167554 A1 | 8/2005 | Rice et al. |
| 2006/0072986 A1 | 4/2006 | Perlov et al. |
| 2007/0237609 A1 | 10/2007 | Nulman et al. |
| 2007/0258796 A1 | 11/2007 | Englhardt et al. |
| 2007/0274813 A1 | 11/2007 | Elliott et al. |
| 2008/0050217 A1 | 2/2008 | Rice et al. |
| 2008/0051925 A1 | 2/2008 | Rice et al. |
| 2008/0071417 A1 | 3/2008 | Rice et al. |
| 2008/0187419 A1 | 8/2008 | Rice et al. |
| 2008/0213068 A1 | 9/2008 | Weaver |
| 2008/0286076 A1 | 11/2008 | Elliott et al. |
| 2009/0030547 A1 | 1/2009 | Rice et al. |

FOREIGN PATENT DOCUMENTS

| | | |
|---|---|---|
| EP | 0 582 019 | 2/1994 |
| EP | 0 663 686 A1 | 7/1995 |
| EP | 0 663 686 B1 | 6/1997 |
| EP | 0 717 717 | 7/1999 |
| EP | 00735927 | 11/1999 |
| EP | 0 987 750 | 3/2000 |
| EP | 00912426 | 8/2000 |
| EP | 1 134 641 | 9/2001 |
| JP | 63-020151 | 1/1988 |
| JP | 02-098157 | 4/1990 |
| JP | 10-256346 | 9/1998 |
| JP | 00-062949 | 12/2000 |
| JP | 00-335799 | 12/2000 |
| KR | 2000-0023251 | 4/2000 |
| WO | WO 97/09256 | 3/1997 |
| WO | WO 98/46503 | 10/1998 |
| WO | WO 99/02436 | 1/1999 |
| WO | WO 99/54921 | 10/1999 |
| WO | WO 99/60614 | 11/1999 |
| WO | WO 99/64207 | 12/1999 |
| WO | WO 00/69724 | 11/2000 |
| WO | WO 02/19392 | 3/2002 |

OTHER PUBLICATIONS

Virvalo, T.K., "Cylinder Speed Synchronization", Dec. 1978, Hydraulics and Pneumatics, vol. 31, No. 12, pp. 55-57.

Cheng, et al., "Adaptive Synchronization Control of a Robotic Manipulator Operating in an Intelligent Workcell", Apr. 1990, IEEE Transactions on Industrial Electronics, vol. 37, pp. 119-126.

Shih-Hung Li, et al. "An Ultrahigh Speed Assembly Robot System. Part I. Design", 1994, Proceedings 1994 Japan-U.S.A. Symposium on Flexible Automation—A Pacific Rim Conference, vol. 2, pp. 465-72.

Roberts, et al., "Feed Chute Geometry for Minimum Belt Wear", Sep. 1998, 6th International Conference on Bulk Materials Storage, Handling and Transportation, pp. 153-159.

Saigo, et al., "Drive Control Systems for Processing Lines", Nov. 10, 2000, Fuji Jiho (Fuji Electric Journal), vol. 73, No. 11, pp. 45-49, Japanese language (Abstract only).

Saigo, K., "Variable-speed Drive Systems for Industrial Plants", Nov. 10, 2000, Fuji Jiho (Fuji Electric Journal), vol. 73, No. 11, pp. 10-14, Japanese language (Abstract only).

Park, et al., "Task Sequence Optimization for a Dual-Robot Assembly System using Evolutionary Algorithms", 2001, Proceedings of the Institution of Mechanical Engineers, Part B (Journal of Engineering Manufacture), vol. 215, No. B6, pp. 835-846.

Office Action of Taiwan Application No. 092124034 dated Mar. 10, 2009.

Office Action of Chinese Application No. 03823887.X dated Dec. 22, 2006.

Second Office Action of Chinese Application No. 03823887.X dated Aug. 10, 2007.

International Search Report of International Application No. PCT/US03/26918 mailed Mar. 10, 2004.

Office Action of U.S. Appl. No. 10/650,479 mailed Dec. 15, 2005.

Mar. 15, 2006 Response to Office Action of U.S. Appl. No. 10/650,479 mailed Dec. 15, 2005.

Final Office Action of U.S. Appl. No. 10/650,479 mailed Jun. 2, 2006.

Nov. 2, 2006 Response to Final Office Action of U.S. Appl. No. 10/650,479 mailed Jun. 2, 2006.

Office Action of U.S. Appl. No. 10/650,479 mailed Apr. 13, 2007.

Jul. 13, 2007 Response to Office Action of U.S. Appl. No. 10/650,479 mailed Apr. 13, 2007.

Final Office Action of U.S. Appl. No. 10/650,479 mailed Oct. 9, 2007.

Notice of Abandonment of U.S. Appl. No. 10/650,479 mailed Jun. 30, 2008.

METHOD AND APPARATUS FOR SUPPLYING SUBSTRATES TO A PROCESSING TOOL

This application is a continuation of and claims priority to U.S. patent application Ser. No. 10/650,479, filed Aug. 28, 2003, which claims priority to U.S. provisional application Ser. No. 60/407,336, filed Aug. 31, 2002. Each of these applications is hereby incorporated by reference herein in its entirety for all purposes.

CROSS REFERENCE TO RELATED APPLICATIONS

The present application is related to the following commonly-assigned, co-pending U.S. patent applications, each of which is hereby incorporated by reference herein in its entirety:

U.S. Provisional Patent Application Ser. No. 60/407,451, filed Aug. 31, 2002 and titled "System For Transporting Wafer Carriers";

U.S. Provisional Patent Application Ser. No. 60/407,339, filed Aug. 31, 2002 and titled "Method and Apparatus for Using Wafer Carrier Movement to Actuate Wafer Carrier Door Opening/Closing";

U.S. Provisional Patent Application Ser. No. 60/407,474, filed Aug. 31, 2002 and titled "Method and Apparatus for Unloading Wafer Carriers from Wafer Carrier Transport System";

U.S. Provisional Patent Application Ser. No. 60/407,452, filed Aug. 31, 2002 and titled "End Effector Having Mechanism For Reorienting A Wafer Carrier Between Vertical And Horizontal Orientations";

U.S. Provisional Patent Application Ser. No. 60/407,337, filed Aug. 31, 2002, and titled "Wafer Loading Station with Docking Grippers at Docking Stations";

U.S. Provisional Patent Application Ser. No. 60/407,340, filed Aug. 31, 2002 and titled "Wafer Carrier having Door Latching and Wafer Clamping Mechanism";

U.S. Provisional Patent Application Ser. No. 60/443,087, filed Jan. 27, 2003 and titled "Methods and Apparatus for Transporting Wafer Carriers";

U.S. Patent Application Ser. No. 60/407,463, filed Aug. 31, 2002 and titled "Wafer Carrier Handler That Unloads Wafer Carriers Directly From a Moving Conveyor".

U.S. Patent Application Ser. No. 60/443,004, filed Jan. 27, 2003 and titled "Wafer Carrier Handler That Unloads Wafer Carriers Directly From a Moving Conveyor".

U.S. Provisional Patent Application Ser. No. 60/443,153, filed Jan. 27, 2003 and titled "Overhead Transfer Flange and Support for Suspending Wafer Carrier";

U.S. Provisional Patent Application Ser. No. 60/443,001, filed Jan. 27, 2003 and titled "Systems and Methods for Transferring Wafer Carriers Between Processing Tools"; and U.S. Provisional Patent Application Ser. No. 60/443,115, filed Jan. 27, 2003 and titled "Apparatus and Method for Storing and Loading Wafer Carriers".

FIELD OF THE INVENTION

The present invention relates generally to substrate processing, and more particularly to an apparatus and method for supplying substrates to a processing tool.

BACKGROUND OF THE INVENTION

Semiconductor devices are made on substrates, such as silicon substrates, glass plates or the like, often termed wafers, for use in computers, monitors, and the like. These devices are made by a sequence of fabrication steps, such as thin film deposition, oxidation, etching, polishing, and thermal and lithographic processing. Although multiple fabrication steps may be performed in a single processing apparatus, substrates typically must be transported between different processing tools for at least some of the fabrication steps.

Substrates are often stored in carriers for transfer between processing tools and other locations. In order to ensure that a processing tool does not idle, a nearly continuous supply of unprocessed substrates should be available to the tool. Thus, loading and storage apparatuses are conventionally located adjacent each processing tool. Such loading and storage apparatuses generally include one or more docking stations where substrate carriers are opened and individual substrates are extracted from the carriers and transported to a processing tool, as well as including a plurality of storage shelves positioned above the docking stations, a factory load location for receiving carriers at the loading and storage apparatus, and a robot adapted to transfer carriers among the factory load location, the docking stations and the plurality of storage shelves. The robot may include an end effector coupled to a support structure. Typically the support structure comprises a vertical guide and a horizontal guide configured so that the end effector may move horizontally and vertically among the docking stations, the plurality of storage shelves and the factory load location.

The loading and storage apparatuses may be modularly designed (e.g. having components that are mounted to a frame typically extending in front of a single processing tool) or may be nonmodular in design (e.g., having components that may be mounted independently and typically having horizontal and/or vertical guides that extend in front of a plurality of processing tools).

After a carrier is received at the factory load location, it may be moved by the robot from the factory load location to one of the storage shelves. Thereafter, the carrier may be moved from the storage shelf to a docking station. After the substrates have been extracted from the carrier, processed, and returned to the carrier, the carrier may be moved by the robot from the docking station to one of the storage shelves. Thereafter, the carrier may be moved by the robot from the storage shelf to the factory load location. Shuffling of the substrate carriers among the storage shelves, the factory load location and the docking station may place a significant burden on the robot, and may extend the period of time during which the substrates in the carrier are present in the factory without being processed. It accordingly would be desirable to streamline the handling of substrate carriers.

SUMMARY OF THE INVENTION

In a first aspect of the invention, a first method is provided for supplying substrates to a processing tool. The first method includes the steps of (1) providing a plurality of load ports each having a mechanism adapted to open a substrate carrier; (2) providing a factory exchange location at which substrate carriers are exchanged with a substrate carrier transport device while the substrate carriers are in motion and being transported by the substrate carrier transport device; (3) providing a carrier handler having an end effector adapted to contact a substrate carrier, the carrier handler being adapted to transport substrate carriers between the factory exchange location and the plurality of load ports; and (4) receiving a first plurality of substrate carriers at the factory exchange location from the substrate carrier transport device. For each of the first plurality of substrate carriers, the method further includes the steps of (1) transporting the substrate carrier from the factory exchange location directly to a respective one of the plurality of load ports; (2) docking and opening the substrate carrier at the respective load port; (3) undocking and closing the substrate carrier at the respective load port; (4) transporting the substrate carrier from the respective load port directly to the factory exchange location; and (5) returning the substrate carrier to the substrate carrier transport device.

In a second aspect of the invention, a second method is provided for transferring a substrate carrier. The second method includes the steps of (1) conveying the substrate carrier on a substrate carrier conveyor positioned adjacent a substrate loading station that includes a substrate carrier handler adapted to transport the substrate carrier to a load port of a processing tool; (2) employing an end effector of the substrate carrier handler of the substrate loading station to disengage the substrate carrier from the substrate carrier conveyor while the substrate carrier is in motion and being transported by the substrate carrier conveyor; (3) transporting the substrate carrier from the substrate carrier conveyor directly to the load port; (4) docking and opening the substrate carrier at the load port; (5) undocking and closing the substrate carrier at the load port; and (6) returning the substrate carrier directly to the substrate carrier conveyor.

In a third aspect of the invention, a third method is provided for transferring a substrate carrier to a substrate loading station. The third method includes conveying the substrate carrier on a substrate carrier conveyor positioned adjacent the substrate loading station. The substrate loading station comprises a substrate carrier handler adapted to transport the substrate carrier to a first load port of a processing tool, the substrate carrier handler including (1) a vertical guide; (2) a horizontal guide coupled to the vertical guide; and (3) an end effector adapted to support the substrate carrier and to move vertically relative to the vertical guide and horizontally relative to the horizontal guide.

The third method further includes (1) employing the end effector of the substrate carrier handler of the substrate loading station to disengage the substrate carrier from the substrate carrier conveyor; (2) transporting the substrate carrier from the substrate carrier conveyor directly to the first load port; (3) docking and opening the substrate carrier at the first load port; (4) undocking and closing the substrate carrier at the first load port; and (5) returning the substrate carrier directly to the substrate carrier conveyor. Numerous other aspects are provided, as are systems and apparatus in accordance with these and other aspects of the invention. The inventive methods may similarly provide for exchange, transport and placement of individual substrates (i.e., those not in or on a substrate carrier), with use of a substrate handler having an end effector adapted to contact and transport an individual substrate.

In accordance with the inventive methods and apparatus, a substrate/substrate carrier that is supplied to a processing tool is transferred directly from the factory exchange location to a load port. The substrate/substrate carrier is transferred "directly" from the factory exchange location to a load port in the sense that it is transferred without the handler placing the substrate/substrate carrier on any support location other than a load port.

The inventive methods and apparatus provide for streamlined and highly efficient transfer of substrates and/or substrate carriers to and from processing tool load ports. Consequently, the total time required to transport and process substrates may be reduced, the costs and capital investment entailed in substrate work-in-process may be reduced, and burdens on substrate carrier handling robots may be diminished.

Further features and advantages of the present invention will become more fully apparent from the following detailed description of exemplary embodiments, the appended claims and the accompanying drawings.

DETAILED DESCRIPTION

Relevant Terminology

As used herein, the term "docking" refers to the inward motion of a substrate or substrate carrier toward a port through which a substrate is exchanged, such as a port in a clean room wall. Similarly, "undocking" refers to the outward motion of the substrate or substrate carrier away from a port through which substrates are exchanged, such as a port in a clean room wall.

A "factory exchange location" includes all points in space at which a substrate or substrate carrier is handled by a device during removal of the substrate or substrate carrier from or placement of the substrate carrier on a substrate or substrate carrier transport device.

A "substrate or substrate carrier transport device" includes a conveyor, an automatic guided vehicle (AGV) or any other device that transfers substrates or substrate carriers to or from processing tool loading locations.

A "processing tool" comprises one or more processing chambers and one or more substrate handlers for loading and unloading the processing chamber. The substrate handlers may or may not be enclosed in chambers of their own such as factory interface chambers or transfer chambers. The processing chamber may perform a vacuum, atmospheric or other process on the substrate, including for example physical vapor deposition (PVD), chemical vapor deposition (CVD), etching, metrology, cleaning, polishing, etc.

A "load port" comprises a location where substrates or substrate carriers are placed for substrate transfer to and/or from a processing tool.

System Description

Figure 1:
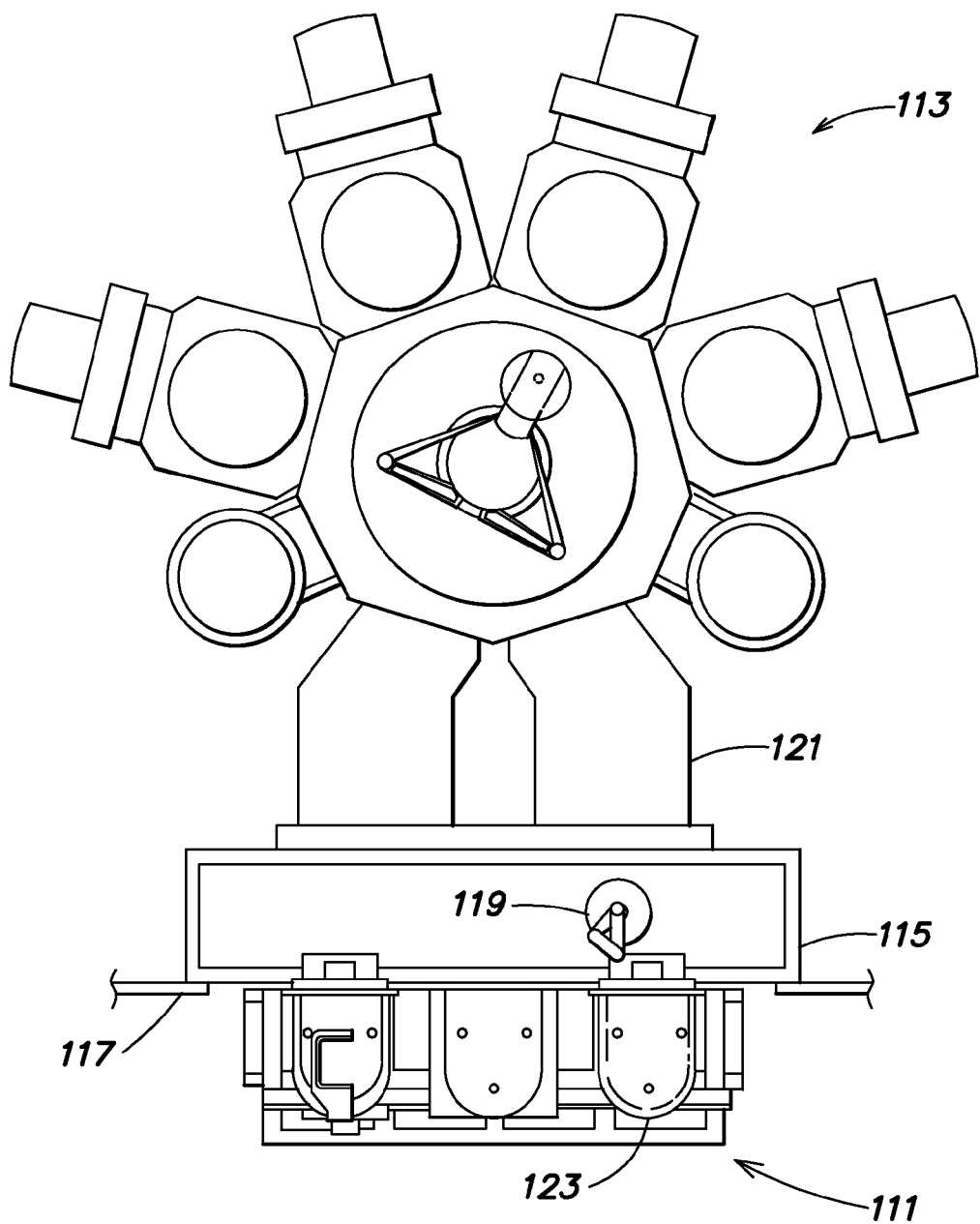
FIG. 1 is a top plan view of a conventional arrangement of a processing tool and associated substrate carrier loading and storage apparatus.
Figure 2:
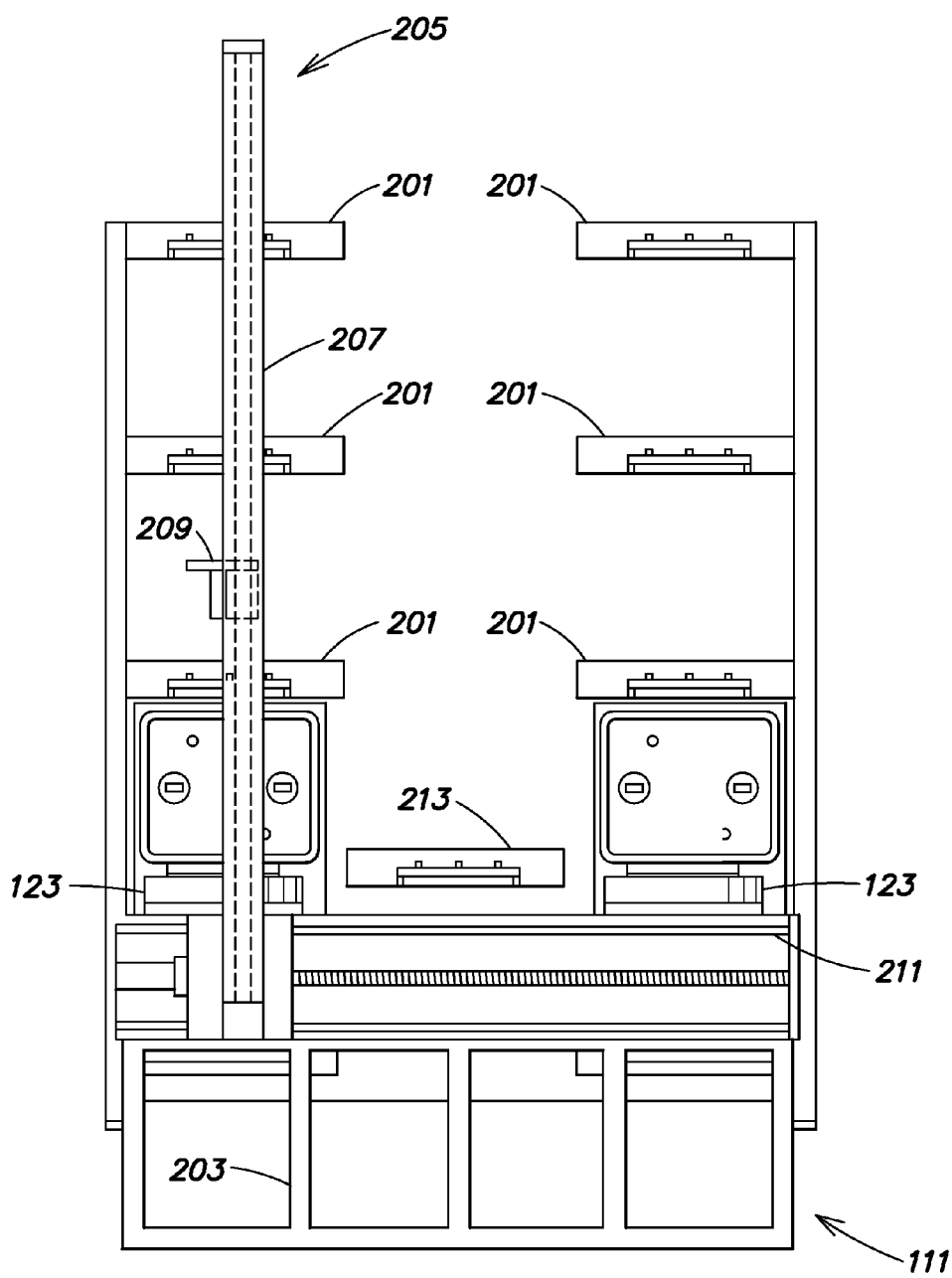
FIG. 2 is a front elevational view showing the conventional loading and storage apparatus of FIG. 1.

FIG. 1 is a top plan view showing a conventional modular loading and storing apparatus 111 in position for storing carriers adjacent a conventional processing tool 113. FIG. 2 is a front elevational view showing the modular loading and storing apparatus 111. Referring initially to FIG. 1, a front end robot chamber 115 (or factory interface) is shown positioned between the loading and storage apparatus 111 and the processing tool 113. As shown in FIG. 1 the loading and storage apparatus 111 is positioned adjacent a first side of a clean room wall 117 and the front end robot chamber 115 is positioned adjacent a second side of the clean room wall 117. The front end robot chamber 115 contains a robot 119 that may move horizontally along a track (not shown) so as to extract substrates from the loading and storage apparatus 111 and transport them to a loadlock chamber 121 of the processing tool 113. The loading and storage apparatus 111 comprises a pair of loading stations 123 where substrate carriers are placed for substrate extraction (in this example the loading stations are equipped with docking movement and are therefore referred to as docking stations), and a plurality of storage shelves 201 (best shown in FIG. 2) positioned above (e.g., at a higher elevation than) the docking stations 123. The storage shelves 201 are mounted on a support frame 203. Also mounted on the support frame 203 is a substrate carrier handling robot 205. The robot 205 includes a vertical guide 207 on which an end effector 209 is mounted for vertical motion. The vertical guide 207 is mounted for horizontal motion along a horizontal guide 211. A factory load location 213 for receiving substrate carriers is positioned between the docking stations 123.

By virtue of the vertical guide 207 and the horizontal guide 211, the end effector 209 of the substrate carrier handling robot 205 is able to move substrate carriers among the factory load location 213, the storage shelves 201 and the docking stations 123. However, as noted before, shuffling of substrate carriers from the factory load location 213 to the storage shelves 201, then to the docking stations 123, and back to the factory load location 213 (possibly via the storage shelves 201) may result in a significant amount of time being consumed in supplying substrates to the processing tool 113, thereby increasing the quantity of work-in-process.

Figure 3A:
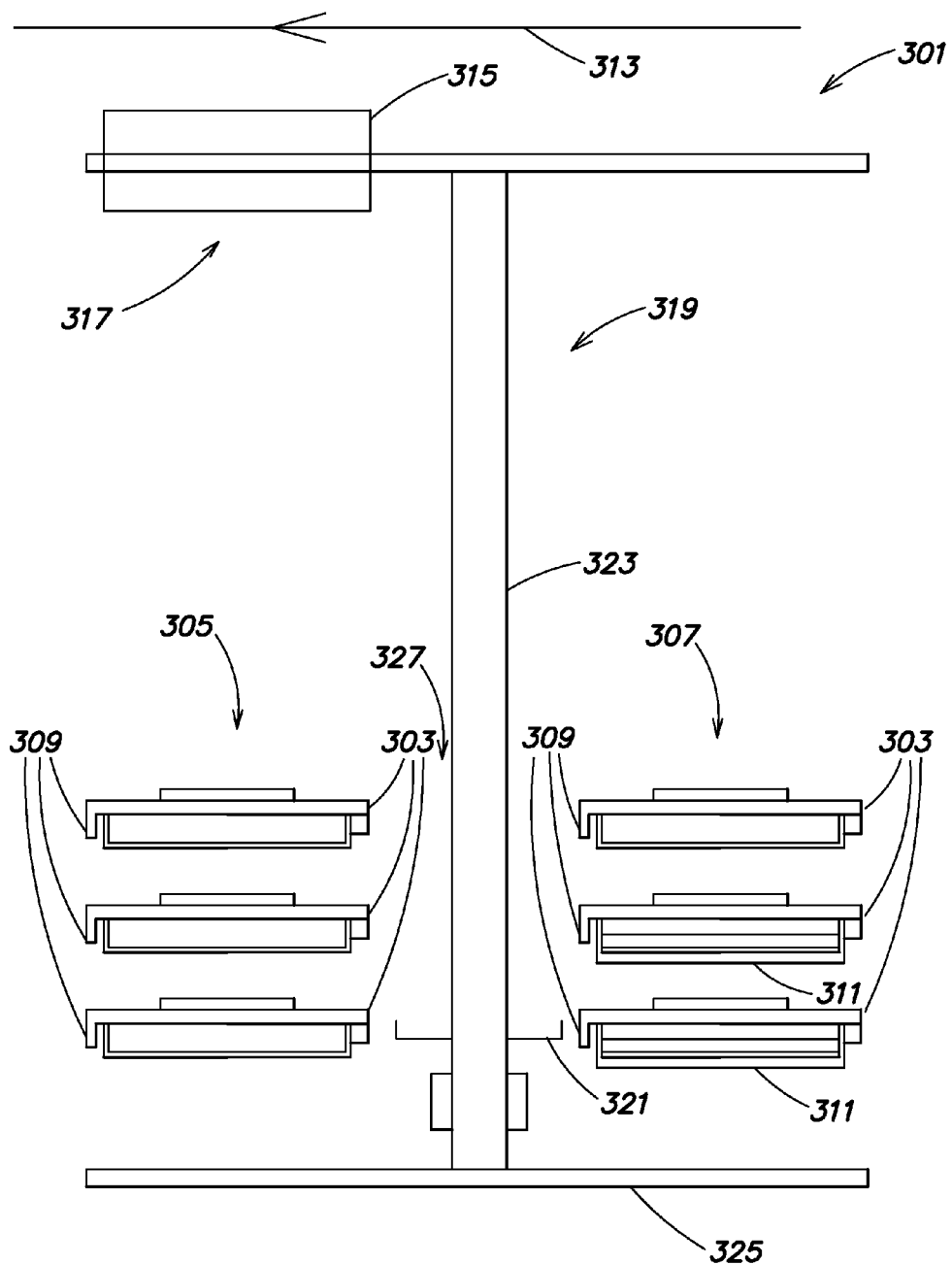
FIGS. 3A and 3B are front elevational views showing two exemplary embodiments of a substrate carrier loading apparatus provided in accordance with the invention.

FIG. 3A is a schematic front elevational view of an exemplary substrate loading station provided in accordance with the present invention. Reference numeral 301 generally indicates the inventive substrate loading station. The loading station 301 includes a plurality of load ports 303. Preferably each load port 303 has a docking mechanism (not shown) such as a motorized gripper or platform adapted to support a substrate carrier and adapted to move the substrate carrier toward and away from the opening through which a substrate is to be transferred. In the particular embodiment illustrated in FIG. 3A, the load ports 303 are arranged in two stacks 305, 307 of three load ports each. Thus a total of six load ports 303 are present in the embodiment of FIG. 3A. Other numbers and/or arrangements of load ports may be employed. The stack 307 is positioned spaced apart from and to a side of the stack 305. Each load port 303 may include a mechanism, generally represented by reference number 309, for opening substrate carriers docked at the load ports 303. In one embodiment of the invention, the load ports 303 are adapted to receive single substrate carriers. The term "single substrate carrier" refers to a substrate carrier shaped and sized to contain only one substrate at a time. In general, the load ports 303 may accommodate any type of substrate carrier (e.g., a single substrate carrier, a multi-substrate carrier, a front opening substrate carrier, a front opening unified pod, a combination thereof, etc.). FIG. 3A shows substrate carriers 311 docked at two of the load ports 303.

In one embodiment, each load port 303 is adapted to open a substrate carrier 311 simultaneously with substrate carrier docking (e.g., the movement of the carrier toward the port in the clean room wall). Such opening may be achieved for example via a cam and follower arrangement. A load port of this type is disclosed in previously incorporated, co-pending U.S. patent application Ser. No. 60/407,339, filed Aug. 31, 2002 and titled "Method and Apparatus for Using Wafer Carrier Movement to Actuate Wafer Carrier Door Opening/Closing". Alternatively, conventional door opening devices (e.g., that open a carrier after it has been docked) may be employed. Such devices conventionally employ a door receiver that unlocks the carrier door and removes it from the carrier to allow substrate extraction.

A substrate carrier transport device, such as a conveyor (schematically illustrated at 313) is configured to deliver substrate carriers to, and to remove substrate carriers from, the inventive substrate loading station 301. Associated with the inventive loading station 301 and positioned adjacent to the conveyor 313 is a substrate carrier exchange device 315 which is adapted to receive substrate carriers from the conveyor 313 and to deliver substrate carriers to the conveyor 313. Accordingly, it will be recognized that the substrate carrier exchange device 315 defines a factory exchange location 317 at which substrate carriers are exchanged with the conveyor 313. The substrate carrier exchange device 315 may be, for example, of the type shown in previously incorporated U.S. patent application Ser. No. 60/407,451, filed Aug. 31, 2002 and titled "System For Transporting Wafer Carriers" which discloses a rotating platform that rotates so as to contact and couple/decouple a substrate carrier to or from the overhead factory transport system.

As another alternative, the substrate carrier exchange device 315 may be of the type disclosed in co-pending U.S. patent application Ser. No. 09/755,394 which discloses an elevating member that extends linearly upward so as to contact and couple/decouple a substrate carrier to or from the overhead factory transport system (and which is hereby incorporated by reference herein in its entirety). As still another alternative, the substrate carrier exchange device 315 may be of the type disclosed in previously incorporated U.S. patent application Ser. No. 60/407,474, filed Aug. 31, 2002 and titled "Method and Apparatus for Unloading Wafer Carriers from Wafer Carrier Transport Systems" which discloses a rotary arm that rotates so as to contact and couple/decouple a substrate carrier to or from the overhead factory transport system. In yet a further alternative, the substrate carrier exchange device may be omitted, and the carrier handler may exchange substrate carriers with the carrier transport device 313 at the factory exchange location (e.g., any location where carriers are exchanged between the inventive loading station and the carrier transport device). Such a method is described in detail in co-pending U.S. patent application Ser. Nos. 60/407,463, filed Aug. 31, 2002 and 60/443,004, filed Jan. 27, 2003.

The substrate carrier exchange device 315 may be configured, for example, to remove substrate carriers from the conveyor 313 while the conveyor (or a carrier transported thereon) is in motion, and to deliver substrate carriers to the conveyor 313 while the conveyor (or a substrate carrier transporter traveling therealong) is in motion. Thus it may be practical to maintain the conveyor 313 in continuous motion while the semiconductor fabrication facility is in operation, thereby improving transportation of substrates through the fabrication facility, reducing the amount of time required for each particular substrate to traverse the fabrication facility, and thereby reducing the total number of substrates present as work-in-process, at any given time.

The inventive loading station 301 further includes a carrier handler 319. The carrier handler 319 includes an end effector 321 that is adapted to contact the substrate carriers 311. For example, the end effector 321 may be adapted to support the substrate carriers 311 from the bottom, or to grip the substrate carriers 311 from the top, etc.

Figure 3B:
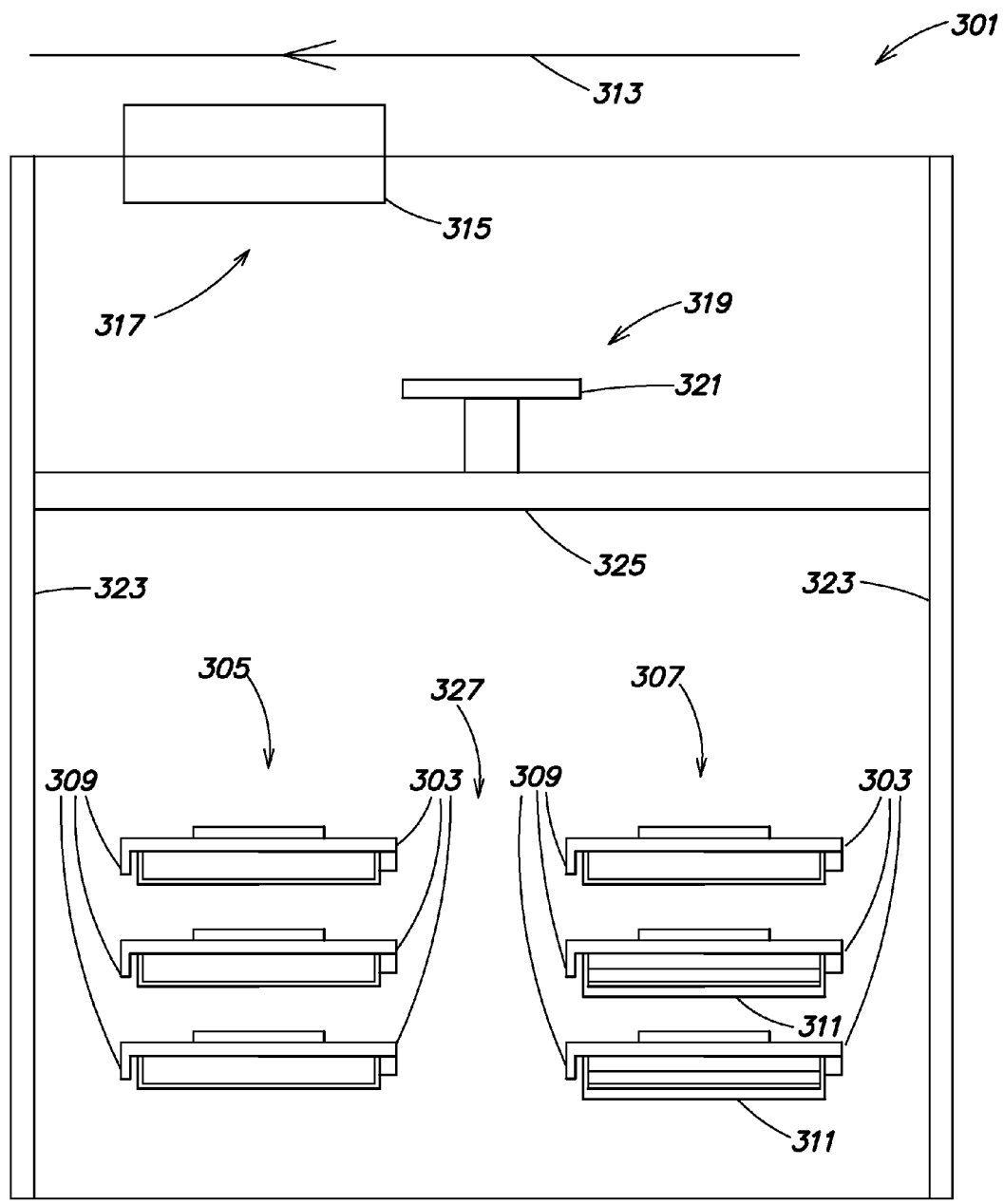

The end effector 321 is adapted to move vertically along a vertical guide 323. The vertical guide 323, in turn, is adapted to move horizontally along a horizontal guide 325. Consequently, the end effector 321 is movable among the factory exchange location 317 and all of the load ports 303. It will also be appreciated that the end effector 321 is movable vertically in a space 327 that is between the stacks 305, 307 of load ports 303. In one alternative the vertical and horizontal guides may be repositioned as shown in FIG. 3B, such that the end effector 321 may be adapted to move horizontally along the horizontal guide 325 and such that the horizontal guide 325 moves vertically along the vertical guide 323. Though not shown in FIG. 3A or 3B, the inventive load station may include one or more storage shelves for storing substrates and/or substrate carriers.

Figure 4:
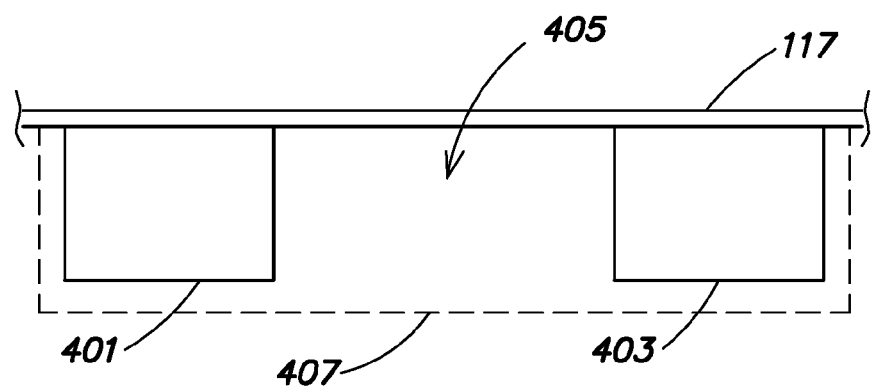
FIG. 4 is a schematic plan view illustrating footprints of stacks of load ports shown in FIG. 3A or 3B.

FIG. 4 is a schematic top plan view illustrating features of the layout of the inventive loading station 301. In FIG. 4, reference numeral 117 indicates the clean room wall. Reference numeral 401 indicates the footprint of the stack 305 of load ports 303. Reference numeral 403 indicates the footprint of the stack 307 of load ports 303. It is to be understood that the "footprint" of an item is the projection of the item on the floor of the facility. Reference numeral 405 indicates an area between the footprints 401 and 403. A tool "envelope" of the inventive loading station should be understood to mean the footprints 401 and 403 plus the area 405 between the footprints 401 and 403. Reference numeral 407 indicates the tool envelope defined by the stacks 401 and 403.

The carrier handler 319 may operate such that it moves substrate carriers 311 only within the envelope defined by the footprints 401, 403 of the load port stacks 305, 307. A controller C controls the operation of the carrier handler 319 and is programmed such that the carrier handler operates in accordance with the invention as described in detail with reference to the flow chart of FIG. 6.

Referring again to FIG. 3A or 3B, it will be observed that the factory exchange location 317 is at a height that is greater than respective heights of the load ports 303. It will also be observed that the factory exchange location 317 and the stack 305 of load ports 303 have substantially the same footprint. However, other arrangements of the inventive loading station 301 are contemplated. For example, the factory exchange location 317 may be at or below the height of the load ports 303. Also, the footprint of the factory exchange location 317 may coincide with the footprint 403 (FIG. 4) of the stack 307 of load ports 303. As another alternative, the footprint of the factory exchange location 317 may not coincide with either one of the footprints 401, 403 of the stacks 305, 307 of load ports 303.

Figure 5:
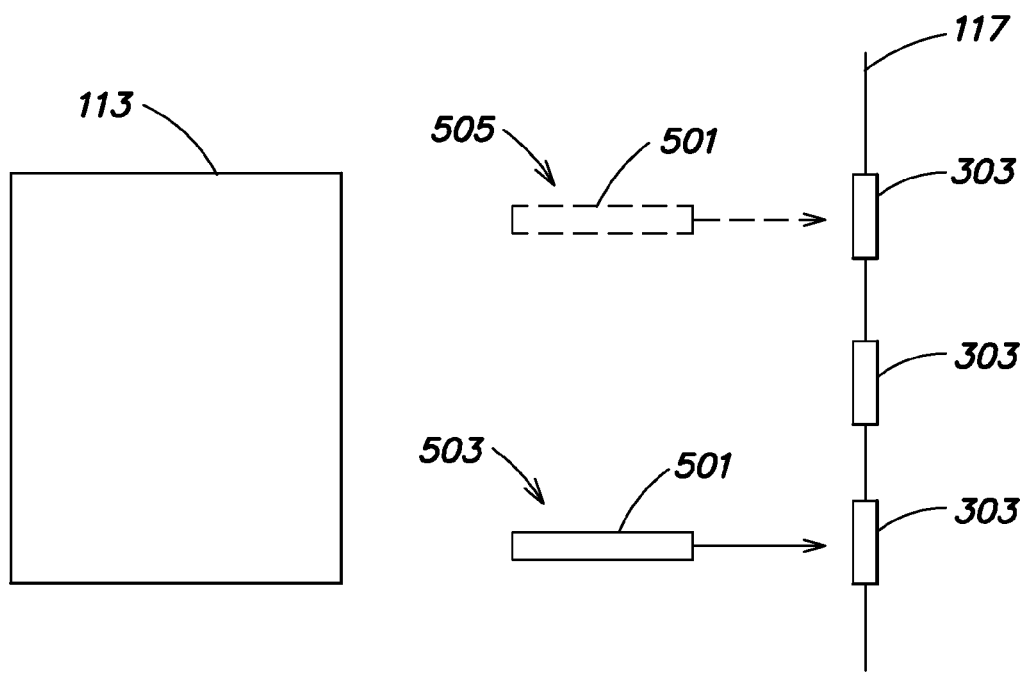
FIG. 5 is a schematic side view showing a substrate handler accessing load ports shown in FIG. 3A or 3B.

FIG. 5 is a schematic side view showing a substrate handler in relation to a conventional processing tool 113 and stacked load ports 303 of the inventive loading station 301 (FIG. 3A OR 3B). Referring to FIG. 5, reference numeral 501 indicates a substrate handler provided in accordance with the invention. The inventive substrate handler 501 may be selectively positioned at a lower position (indicated by reference numeral 503), at which the inventive substrate handler 501 can be moved horizontally to access a lowest one of the stacked load ports 303. The inventive substrate handler 501 can also be selectively positioned at an upper position (indicated in phantom and represented by reference numeral 505) at which the inventive substrate handler 501 can be moved horizontally to access the uppermost of the stacked load ports 303. It will be appreciated that the inventive substrate handler 501 may also be selectively positioned at any intermediate position (not specifically indicated in the drawing) that is between the indicated positions 503 and 505, for example, at a position at which the inventive substrate handler 501 can be moved horizontally to access a middle one of the stacked load ports 303.

As used herein, a substrate handler is said to "access" a load port when the substrate handler extends into the load port area (e.g., to transport a substrate).

It will be appreciated that, after the inventive substrate handler 501 removes a substrate (not shown) from a substrate carrier 311 (FIG. 3A OR 3B, not shown in FIG. 5) docked to one of the stacked load ports 303, the inventive substrate handler 501 may supply the substrate to the processing tool 113, or, more specifically, to a load lock chamber 121 (FIG. 1, not separately shown in FIG. 5) of the processing tool 113.

Figure 6:
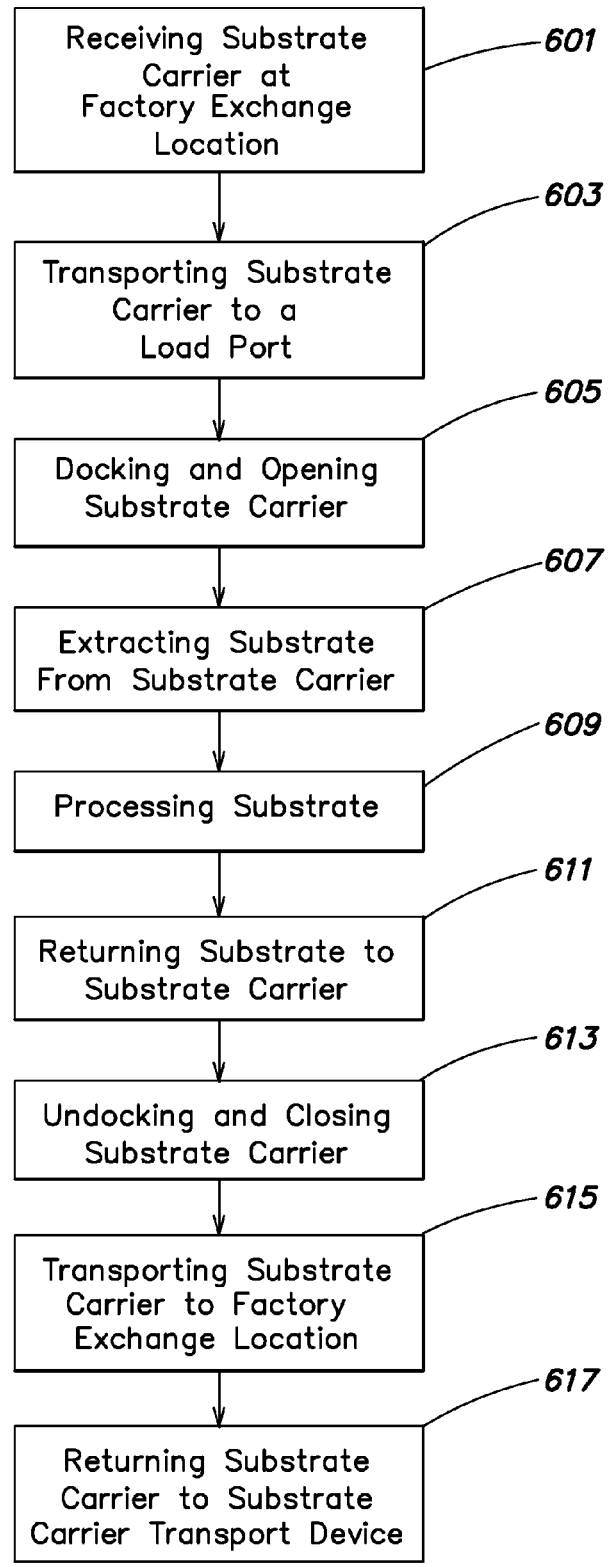
FIG. 6 is a flow chart that illustrates a manner of operating the inventive substrate carrier loading apparatus of FIG. 3A or 3B and an associated processing tool.

FIG. 6 is a flow chart that illustrates operation of a substrate loading station configured in accordance with the present invention, such as the inventive substrate loading station 301 of FIG. 3A or 3B. A controller C may be coupled to the substrate loading station and operative to perform one or more steps of the process of FIG. 6.

According to a first step 601 in FIG. 6, a substrate carrier 311 is received at the factory exchange location 317. In the exemplary substrate loading station 301 of FIG. 3A or 3B, for example, the carrier exchange device 315 removes a substrate carrier 311 from the conveyor 313 (e.g., via the end effector 321). This may occur, for example, while the conveyor 313 is in motion.

Following step 601 in FIG. 6 is step 603. At step 603 the carrier handler 319 transports the substrate carrier 311 from the factory exchange location 317 to one of the load ports 303. In accordance with the invention the substrate carrier 311 is transported directly from the factory exchange location 317 to one of the load ports 303. That is, the carrier handler 319 does not place the substrate carrier 311 at any carrier support location other than one of the load ports 303 after removing the substrate carrier 311 from the factory exchange location 317 and before placing the substrate carrier 311 at one of the load ports 303.

Following step 603 in FIG. 6 is step 605. At step 605, the substrate carrier 311 is docked and opened at one of the load ports 303 at which it was placed by the carrier handler 319. As noted above, the load port 303 may be adapted such that docking and opening of the substrate carrier 311 occurs simultaneously.

Step 607 follows step 605 in FIG. 6. At step 607, the substrate handler 501 extracts a substrate from the substrate carrier 311 that has been docked at and opened by one of the load ports 303. The extracted substrate is then supplied to the processing tool 113 by the substrate handler 501, and processing of the substrate (step 609) occurs within the processing tool 113.

After processing of the substrate in the processing tool 113 is complete, the substrate handler 501 returns the substrate to the substrate carrier 311 that was docked and opened at one of the load ports 303 (step 611). Then the substrate carrier 311 in which the processed substrate was inserted is closed and undocked from the load port 303 (step 613). The undocking and closing of the substrate carrier 303 may occur simultaneously. Following step 613 in FIG. 6 is step 615. At step 615 the carrier handler 319 transports the substrate carrier 311 from the load port 303 to the factory exchange location 317. According to an aspect of the invention, the substrate carrier 311 may be transported directly from the load port 303 to the factory exchange location 317. That is, the substrate carrier 311 may be transported from the load port 303 to the factory exchange location 317 without being placed on any carrier support location after being removed from the load port 303 and before being delivered to the factory exchange location 317.

Following step 615 in FIG. 6 is step 617. At step 617, the carrier exchange device 315 returns the substrate carrier 311 to the conveyor 313. In one embodiment of the invention, this may be done while the conveyor 313 is in motion. It should be noted that the steps of docking and/or opening the substrate carrier may be omitted in systems that transport individual substrates, or that do not require substrates to be docked. Accordingly steps 605 and 613 are optional. It will be understood that the inventive method may be performed with individual substrates rather than substrate carriers. Additional figures directed to the transportation of individual substrates rather than substrate carriers between the carrier transport device and the processing tool are not included so as to avoid repetition.

The methods and apparatuses of the present invention are advantageous in that transportation of the substrate carriers to and from the load ports is streamlined, so that the total time of transit of substrates through the semiconductor fabrication facility may be reduced. This, in turn, may translate into reduced work-in-process, lower capital costs, and a reduced manufacturing cost per substrate.

The foregoing description discloses only exemplary embodiments of the invention; modifications of the above disclosed methods and apparatuses which fall within the scope of the invention will be readily apparent to those of ordinary skill in the art. For example, the carrier handler described above in connection with FIG. 3A or 3B includes a vertical guide that is movable horizontally along a single horizontal guide. It is, however, also contemplated to employ a carrier handler of the type in which a vertical guide is slidably mounted between two parallel horizontal guides. As still another alternative, there may be employed a carrier handler of the type in which a horizontal guide is slidably mounted on one or more vertical guides. Of course, other types of carrier handlers including those that do not use linear guides may be employed.

It is also contemplated to employ other configurations of load ports besides the two stacks of three load ports each shown in FIG. 3A or 3B. For example, there may be only two load ports in each stack of load ports, or, there may be four or more load ports in each stack of load ports. It is also not required that the same number of load ports be provided in each stack of load ports. As still another alternative, only one stack of load ports may be provided, or three or more stacks of load ports may be provided. Note also, that although each stacked loadport is shown as occupying the same footprint, other arrangements with partially overlapping footprints or non-overlapping footprints may be employed. There may be embodiments where a single load port is employed, or where two or more horizontally adjacent load ports are employed.

It is noted that FIG. 5 shows a single substrate handler that is configured to service all of the load ports in a stack of load ports. As possible alternatives, a respective substrate handler may be provided to service each load port. It is also contemplated that a single substrate handler may be employed to service all of the load ports of more than one stack of load ports. It is further contemplated that a respective substrate handler be provided for each stack of load ports.

Substrate carrier transport devices other than the conveyor 313 may be employed to bring substrate carriers to, and transport substrate carriers away from, the factory exchange location. If a conveyor is employed as the substrate carrier transport device, it may optionally be kept continuously in motion while the semiconductor fabrication facility is operating.

Although only one factory exchange location is shown in association with the inventive substrate loading station, it is contemplated to provide two or more factory exchange locations in association with the inventive substrate loading station. For example, a first factory exchange location may be employed for incoming substrate carriers, and a second factory exchange location may be employed for outbound substrate carriers. It is also contemplated that an inventive substrate loading station may be served by more than one substrate carrier transport device.

Preferably, the invention is employed in a substrate loading station that comprises a frame to which the vertical and horizontal guides are coupled. In this manner, the preferred substrate loading station is modular and may be quickly installed and calibrated. In the event the substrate loading station includes one or more storage shelves, each storage shelf also may be mounted on the frame. By mounting both the substrate carrier handler and the storage shelf or shelves to the frame, the substrate carrier handler and storage shelves have a predetermined position relative to each other. This further facilitates installation and calibration, and is another advantage of employing a modular substrate loading station. Similarly, other mechanisms such as dedicated mechanisms for loading and/or unloading substrate carriers from an overhead factory transport system may be advantageously mounted to the frame. Exemplary dedicated mechanisms may comprise rotating platforms or rotating arms, etc., as described in previously incorporated U.S. patent application Ser. Nos. 60/407,451, filed Aug. 31, 2002 and 60/407,474, filed Aug. 31, 2002.

In one aspect, the frame may be mounted to predetermined mounting locations (e.g., predrilled bolt holes, etc.) on the clean room wall, or on the front wall of a chamber (e.g., a factory interface chamber). Preferably, the wall also has predetermined mounting locations to which the docking grippers or docking platforms are mounted. Additionally, the wall may have predetermined mounting locations to which a substrate carrier opening mechanism may be mounted. When the frame, the docking mechanisms, and the substrate carrier opening mechanism are each mounted to predetermined locations on the same surface, the relative positions of each are predetermined, and installation and calibration of the substrate loading station is facilitated.

The present invention has been illustrated in connection with single substrate carriers. However, it is also contemplated to apply the present invention in connection with substrate carriers that hold more than one substrate, or to apply the invention in connection with transport of individual substrates (not transported via carriers). As will be apparent, the inventive apparatus may differ considerably from the exemplary embodiments shown and described herein. Any apparatus that operates in accordance with the method of FIG. 6 (whether or not docking and opening are performed, and whether or not substrate carriers are employed (e.g., individual substrate systems)) may fall within the scope of the present invention.

Accordingly, while the present invention has been disclosed in connection with a preferred embodiment thereof, it should be understood that other embodiments may fall within the spirit and scope of the invention, as defined by the following claims.

The invention claimed is:

1. A method of supplying substrates to a processing tool, comprising:
providing a plurality of load ports having a plurality of direct transfer locations, each load port having a direct transfer location and having a mechanism adapted to open a substrate carrier supported at the direct transfer location, wherein each load port is free of any carrier support location other than the direct transfer location;

providing a factory exchange location at which the substrate carrier is exchanged with a substrate carrier transport device while the substrate carrier is in motion and being transported by the substrate carrier transport device;

providing a carrier handler having an end effector adapted to contact the substrate carrier and disengage the substrate carrier from the substrate carrier transport device while the substrate carrier is in motion and being transported by the substrate carrier transport device, the carrier handler being adapted to remove the substrate carrier from the factory exchange location, to place the substrate carrier only at the load port directly after removing the substrate carrier from the factory exchange location, to remove the substrate carrier from the load port, and to place the substrate carrier at only the factory exchange location directly after removing the substrate carrier from the load port;

wherein carrier support locations other than the carrier handler, the factory exchange location, and the plurality of direct transfer locations of the plurality of load ports are absent;

receiving a first plurality of substrate carriers at the factory exchange location from the substrate carrier transport device via the carrier handler; and providing a controller programmed to perform the steps of:
for each substrate carrier of the first plurality of substrate carriers:
transporting the substrate carrier from the factory exchange location directly to the direct transfer location of a respective one of the plurality of load ports, wherein an absence of carrier support locations other than the direct transfer location is provided to which the carrier handler is adapted to transport the substrate carrier during transporting the substrate carrier from the factory exchange location directly to the direct transfer location;
docking and opening the substrate carrier at the respective load port;
undocking and closing the substrate carrier at the respective load port;
transporting the substrate carrier from the direct transfer location of the respective load port directly to the factory exchange location, wherein an absence of carrier support locations other than the factory exchange location is provided to which the carrier handler is adapted to transport the substrate carrier during transporting the substrate carrier from the direct transfer location directly to the factory exchange location; and
returning the substrate carrier to the substrate carrier transport device via the carrier handler while the substrate carrier transport device is in motion.

2. The method of claim 1, wherein the substrate carriers are single substrate carriers.

3. The method of claim 1, wherein the step of providing a plurality of load ports comprises providing two stacks of load ports.

4. The method of claim 3, wherein the carrier handler moves the substrate carriers only within an envelope defined by footprints of the two stacks of load ports.

5. The method of claim 1, wherein the docking of each substrate carrier occurs simultaneously with opening of the respective substrate carrier.

6. The method of claim 1, wherein the factory exchange location and the load ports have substantially the same footprint.

7. The method of claim 1, wherein the factory exchange location is at a height greater than respective heights of all of the load ports.

8. A substrate loading station for a processing tool, comprising:

a first plurality of load ports having a plurality of direct transfer locations, operatively coupled to the processing tool and each load port having a direct transfer location and having a mechanism adapted to open a substrate carrier supported at the direct transfer location, wherein each load port is free of any carrier support location other than the direct transfer location;

a factory exchange location at which the substrate carrier is exchanged with a substrate carrier transport device while the substrate carrier is in motion and being transported by the substrate carrier transport device; and a carrier handler having an end effector adapted to contact the substrate carrier and disengage the substrate carrier from the substrate carrier transport device while the substrate carrier is in motion and being transported by the substrate carrier transport device, the carrier handler being adapted to remove the substrate carrier from the factory exchange location, to place the substrate carrier only at the load port directly after removing the substrate carrier from the factory exchange location, to remove the substrate carrier from the load port, and to place the substrate carrier at only the factory exchange location directly after removing the substrate carrier from the load port;

wherein carrier support locations other than the carrier handler, the factory exchange location, and the plurality of direct transfer locations of the plurality of load ports are absent;

wherein the factory exchange location is adapted to receive a first plurality of substrate carriers from the substrate carrier transport device via the carrier handler wherein the carrier handler has a controller programmed to perform the steps of:
for each substrate carrier of the first plurality of substrate carriers:
transporting the substrate carrier from the factory exchange location directly to the direct transfer location of a respective one of the plurality of load ports, wherein an absence of carrier support locations other than the direct transfer location is provided to which the carrier handler is adapted to transport the substrate carrier during transporting the substrate carrier from the factory exchange location directly to the direct transfer location;
docking and opening the substrate carrier at the respective load port;
undocking and closing the substrate carrier at the respective load port;
transporting the substrate carrier from the direct transfer location of the respective load port directly to the factory exchange location, wherein an absence of carrier support locations other than the factory exchange location is provided to which the carrier handler is adapted to transport the substrate carrier during transporting the substrate carrier from the direct transfer location directly to the factory exchange location; and returning the substrate carrier to the substrate carrier transport device via the carrier handler while the substrate carrier transport device is in motion.

9. The substrate loading station of claim 8, wherein the substrate carriers transported by the carrier handler are single substrate carriers.

10. The substrate loading station of claim 8, further comprising:
a second plurality of load ports, the second plurality of load ports being spaced apart from and to a side of the first plurality of load ports.

11. The substrate loading station of claim 10, wherein the carrier handler is adapted to move vertically in a space between the first and second pluralities of load ports.

12. The substrate loading station of claim 11, wherein the carrier handler is adapted to move the substrate carriers only within an envelope defined by footprints of the first and second pluralities of load ports.

13. The substrate loading station of claim 8, wherein each of the load ports is adapted to open a substrate carrier simultaneously with the substrate carrier docking with the load port.

14. The substrate loading station of claim 8, wherein the factory exchange location and the load ports have substantially the same footprint.

15. The substrate loading station of claim 8, wherein the substrate carrier transport device is a conveyor.

16. The substrate loading station of claim 8, wherein the factory exchange location is at a height greater than respective heights of all of the load ports.

17. An apparatus adapted to supply substrates to a processing tool, comprising:
a substrate carrier handler adapted to transport a substrate carrier to a first load port of the processing tool, the substrate carrier handler including an end effector adapted to support the substrate carrier, wherein the load port is free of any carrier support location other than a direct transfer location, and; and a controller coupled to the substrate carrier handler and operative to control the substrate carrier handler such that the end effector of the substrate carrier handler disengages the substrate carrier from a substrate carrier conveyor while the substrate carrier is in motion and being transported by the substrate carrier conveyor, the controller further operative to perform the steps of:

transporting the substrate carrier from the substrate carrier conveyor directly to the direct transfer location of the first load port, wherein an absence of carrier support locations other than the direct transfer location is provided to which the substrate carrier handler is adapted to transport the substrate carrier during transporting the substrate carrier from the substrate carrier conveyor directly to the direct transfer location;

docking and opening the substrate carrier at the first load port;

undocking and closing the substrate carrier at the first load port; and returning the substrate carrier directly to the substrate carrier conveyor from the direct transfer location, wherein an absence of carrier support locations other than the substrate carrier conveyor is provided to which the substrate carrier handler is adapted to transport the substrate carrier during returning the substrate carrier directly to the substrate carrier conveyor from the direct transfer location.

* * * * *